United States Patent
Chang et al.

(10) Patent No.: US 12,501,722 B2
(45) Date of Patent: Dec. 16, 2025

(54) IMAGE SENSOR WITH DUMMY POLYSILICON BASED EXTENSION PAD

(71) Applicant: Taiwan Semiconductor Manufacturing Company, Ltd., Hsinchu (TW)

(72) Inventors: Y.C. Chang, Kaohsiung (TW); Yen-Ting Chiang, Tainan (TW); Shyh-Fann Ting, Tainan (TW); Jen-Cheng Liu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 576 days.

(21) Appl. No.: 17/740,544

(22) Filed: May 10, 2022

(65) Prior Publication Data
US 2023/0369380 A1    Nov. 16, 2023

(51) Int. Cl.
*H10F 39/00* (2025.01)
*H10F 39/12* (2025.01)
*H10F 39/18* (2025.01)

(52) U.S. Cl.
CPC .......... *H10F 39/011* (2025.01); *H10F 39/18* (2025.01); *H10F 39/199* (2025.01); *H10F 39/8053* (2025.01); *H10F 39/8063* (2025.01); *H10F 39/811* (2025.01)

(58) Field of Classification Search
CPC .... H10F 39/011; H10F 39/18; H10F 39/8053; H10F 39/8063; H10F 39/811; H10F 39/199
See application file for complete search history.

(56) References Cited

U.S. PATENT DOCUMENTS

| | | | |
|---|---|---|---|
| 10,121,875 B1 | 11/2018 | Ho et al. | |
| 10,121,882 B1 | 11/2018 | Ho et al. | |
| 11,336,848 B1* | 5/2022 | Lloyd | H04N 25/72 |
| 11,398,498 B2 | 7/2022 | Luo et al. | |
| 11,804,523 B2 | 10/2023 | Keech et al. | |
| 2008/0308890 A1* | 12/2008 | Uya | H10F 39/199 |
| | | | 438/73 |
| 2017/0345854 A1 | 11/2017 | Kwon | |
| 2018/0069036 A1 | 3/2018 | Kim et al. | |
| 2020/0043850 A1 | 2/2020 | Yeoh et al. | |
| 2021/0066225 A1* | 3/2021 | Chou | H10F 39/811 |
| 2021/0225920 A1* | 7/2021 | Cheng | H10F 39/811 |
| 2021/0242267 A1 | 8/2021 | Kim et al. | |

(Continued)

FOREIGN PATENT DOCUMENTS

| | | |
|---|---|---|
| TW | 201926560 A | 7/2019 |
| TW | 201926571 A | 7/2019 |

(Continued)

*Primary Examiner* — Georgia Y Epps
*Assistant Examiner* — Erin R Garber
(74) *Attorney, Agent, or Firm* — Sterne, Kessler, Goldstein & Fox P.L.L.C.

(57) ABSTRACT

The present disclosure describes an image sensor and a method for forming the image sensor. The image sensor includes an image sensing element disposed on a substrate, an extension pad disposed adjacent to the image sensing element, and a polysilicon pillar disposed on the extension pad. The image sensor further includes an insulating layer disposed over the image sensing element, the extension pad, and the polysilicon pillar.

20 Claims, 19 Drawing Sheets

(56) References Cited

U.S. PATENT DOCUMENTS

2021/0358908 A1    11/2021  Ehlert et al.
2021/0385403 A1*   12/2021  Eki .................... H04N 25/772
2022/0077216 A1     3/2022  Lim et al.
2022/0302191 A1*    9/2022  Jin .................... H10F 39/811
2024/0355842 A1*   10/2024  Iino ................... H10F 39/8027

FOREIGN PATENT DOCUMENTS

| TW | 201935686 A | 9/2019 |
| TW | 202125816 A | 7/2021 |
| TW | 202145564 A | 12/2021 |
| TW | 202215649 A | 4/2022 |

* cited by examiner

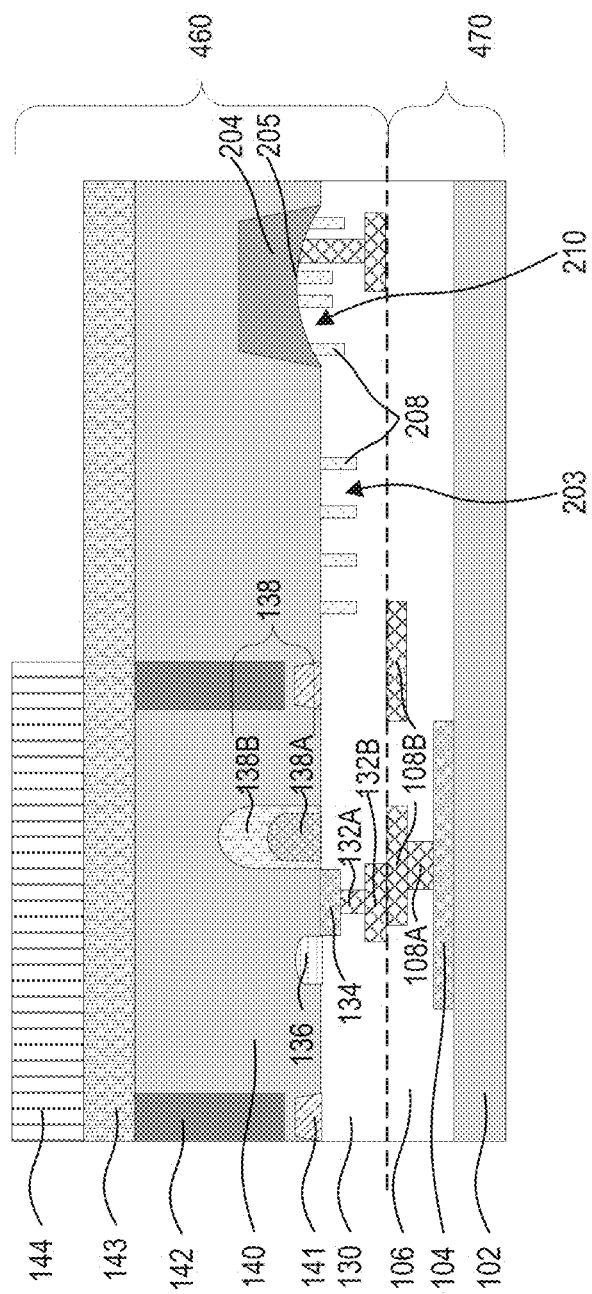
FIG. 22
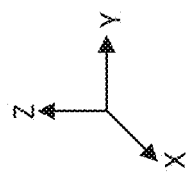

IMAGE SENSOR WITH DUMMY POLYSILICON BASED EXTENSION PAD

BACKGROUND

Semiconductor image sensors are used to sense radiation, such as light, and convert the sensed radiation into electrical signals. Semiconductor image sensors utilize an array of pixels, such as photodiodes, to sense radiation that is projected toward the pixels. These image sensors can include extension pads for electrical connections. Complementary metal-oxide-semiconductor (CMOS) image sensors are used in various applications, such as digital still cameras and mobile phone cameras.

BRIEF DESCRIPTION OF THE DRAWINGS

Aspects of the present disclosure are best understood from the following detailed description when read with the accompanying figures.

FIGS. 6-26 illustrate cross-sectional views of an image sensor at various stages of its fabrication process, in accordance with some embodiments.

DETAILED DESCRIPTION

Figure 1:
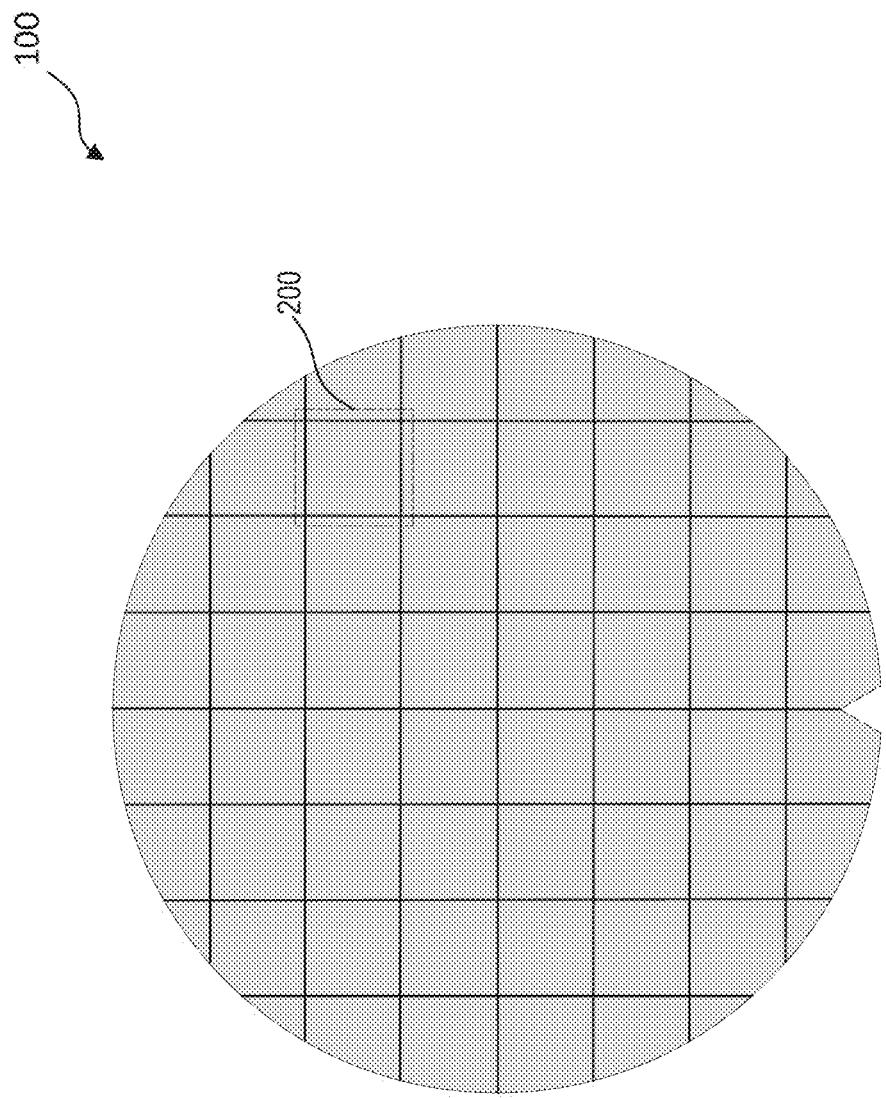
FIG. 1 illustrates a top view of a chip layout on a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The discussion of elements in FIGS. 1-4 and 6-26 with the same annotations applies to each other, unless mentioned otherwise.

Complementary metal-oxide-semiconductor (CMOS) image sensors are used in various applications, such as digital still cameras and mobile phone cameras. CMOS image sensors can include an array of image sensing elements or pixels, such as photodiodes. The pixels can sense radiation, such as light, that is projected toward the pixels. CMOS image sensors can further include extension pads for electrical connections. The extension pads can be large in size. For example, an extension pad with a square shape can have a side length of about 80 µm. Because of the large size of the extension pads, during a chemical mechanical planarization (CMP) process to form the extension pads, a curved surface of the extension pads can be formed relative to a front surface of the substrate on which the image sensor is formed. The curvature of the curved surface of the extension pads can increase after a CMP process to form shallow trench isolation (STI) structures. After an interlayer dielectric (ILD) layer is deposited on the image sensing elements and the extension pads, the ILD layer can be polished by a CMP process. Because of the curved surface of the extension pads, the polished ILD layer can have a nonuniform surface after the CMP process. The polished ILD layer can have a nonuniform surface if a distance between a highest point on the polished ILD layer and a lowest point on the polished ILD layer is greater than about 600 nm. The nonuniform ILD layer can cause fabrication challenges when an interconnect structure is formed in the ILD layer. For example, some metal line openings may be disconnected from some metal via openings. The nonuniform ILD layer can increase electrical connection failures of the interconnect structure. The nonuniform ILD layer can also increase bonding failures after the image sensors are bonded to another substrate containing application-specific circuits. The increased electrical connection failures and the increased bonding failures can reduce device performance and reliability.

The present disclosure provides an example image sensor with an ILD layer with improved uniformity and an example method for fabricating the same. In some embodiments, polysilicon pillars can be formed on the extension pads. The polysilicon pillars can provide structural support for the ILD layer deposited on the extension pads. The polysilicon pillars can reduce the polishing speed of the ILD layer deposited in or around the curved surface of the extension pads. Consequently, the polysilicon pillars can improve the polishing uniformity of the ILD layer across the image sensor. In some embodiments, a distance between a highest point on the polished ILD layer and a lowest point on the polished ILD layer can be less than about 400 nm. In some embodiments, the polysilicon pillars on the extension pads can form a slot region. The slot region can be away from the polysilicon pillars. The slot region can be a rectangular region. The slot region can be used to connect the interconnect structure to the extension pads. The slot region can also be used to bond a wire to the extension pads. In some embodiments, polysilicon pillars can also be formed in an area on the image sensor that is away from the array of pixels. The polysilicon pillars in the area away from the array of pixels can improve the uniformity of the ILD layer in that area. The polysilicon pillars on the extension pads and in the area away from the array of pixels can increase the polishing uniformity of the ILD layer. The uniform ILD layer can reduce electrical connection failures of the interconnect structure. The uniform ILD layer can also reduce bonding failures after the image sensors are bonded to another substrate containing application-specific circuits. The decreased electrical connection failures and the decreased bonding failures can improve device performance and reliability.

FIG. 1 illustrates a top view of a chip layout on a substrate 100, such as a wafer 100, according to some embodiments. Wafer 100 can be a silicon (Si) wafer, a gallium arsenide (GaAs) wafer, a gallium nitride (GaN) wafer, or a silicon-on-insulator (SOI) wafer. Wafer 100 can have a diameter between about 50 mm and about 500 mm. Wafer 100 can be designed to house a number of chips 200. In some embodiments, wafer 100 can house between about 10 chips 200 and about 10,000 chips 200. Each chip 200 can include an image sensor, according to some embodiments.

Figure 2:
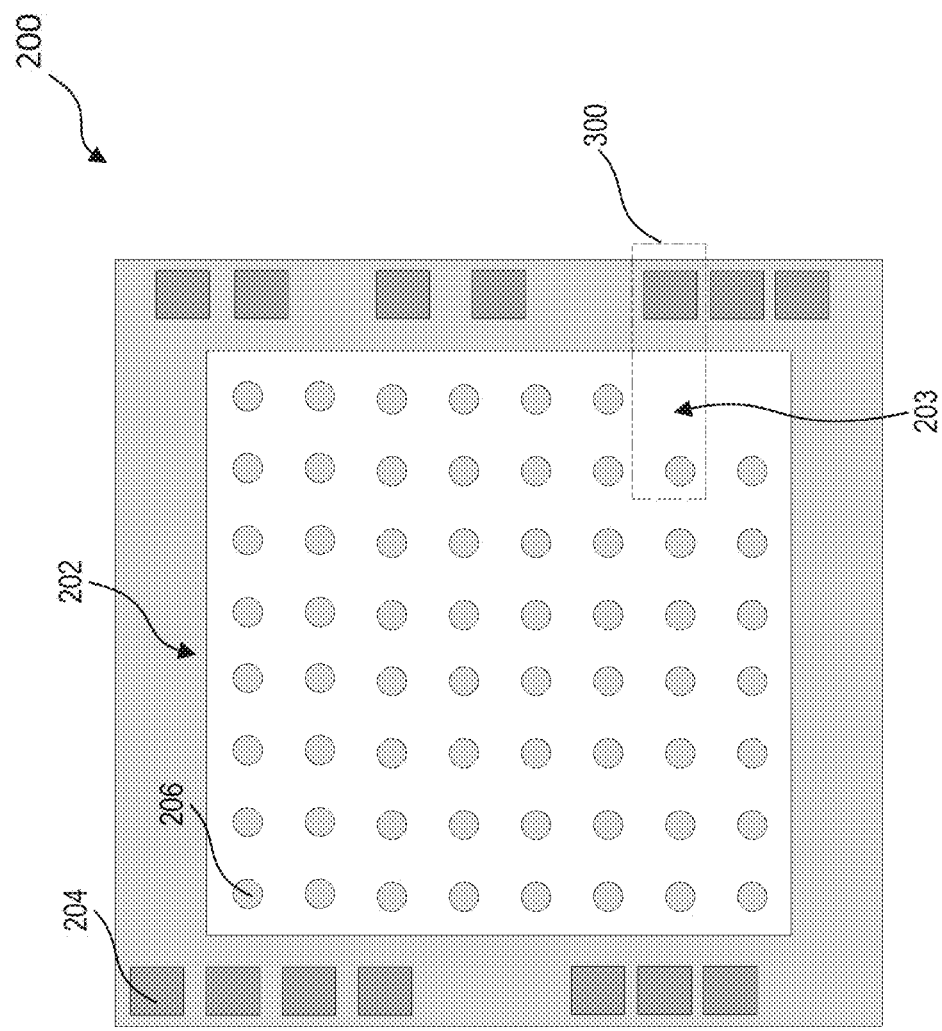
FIG. 2 illustrates a top view of an image sensor, in accordance with some embodiments.

FIG. 2 illustrates a top view of an image sensor 200, according to some embodiments. In some embodiments, FIG. 2 can be an enlarged view of chip 200 in FIG. 1. Image sensor 200 can include a pixel array 202. Pixel array 202 can be at a center portion of image sensor 200. Pixel array 202 can include a number of pixels 206. In some embodiments, pixel array 202 can include between about several thousands of pixels 206 and about several millions of pixels 206. Each pixel 206 can have a size between about 0.01 $\mu m^2$ and about 200 $\mu m^2$. In some embodiments, pixel array 202 can include an area that is away from pixels 206. For example, the lower right corner of pixel array 202, such as area 203 as shown in FIG. 2, is away from pixels 206. In some embodiments, there can be a number of areas of pixel array 202 that are away from pixels 206. The areas away from pixels 206 can cause a nonuniform ILD layer in subsequent operations. In some embodiments, polysilicon pillars (not shown in FIG. 2) can be formed in the areas of pixel array 202 that are away from pixels 206.

Image sensor 200 can include extensions pads 204. Extension pads 204 can be along a side portion of image sensor 200. Extension pads can be large in size. For example, extension pads 204 with a square shape can have a side length of about 80 $\mu m$. The large size of extension pads 204 can cause a nonuniform ILD layer in subsequent operations. In some embodiments, polysilicon pillars (not shown in FIG. 2) can be formed on extension pads 204. Polysilicon pillars (not shown in FIG. 2) on extension pads 204 and in the areas of pixel array 202 that are away from pixels 206 can improve the polishing uniformity of the ILD layer. Area 300 can be a portion of image sensor 200.

Figure 3:
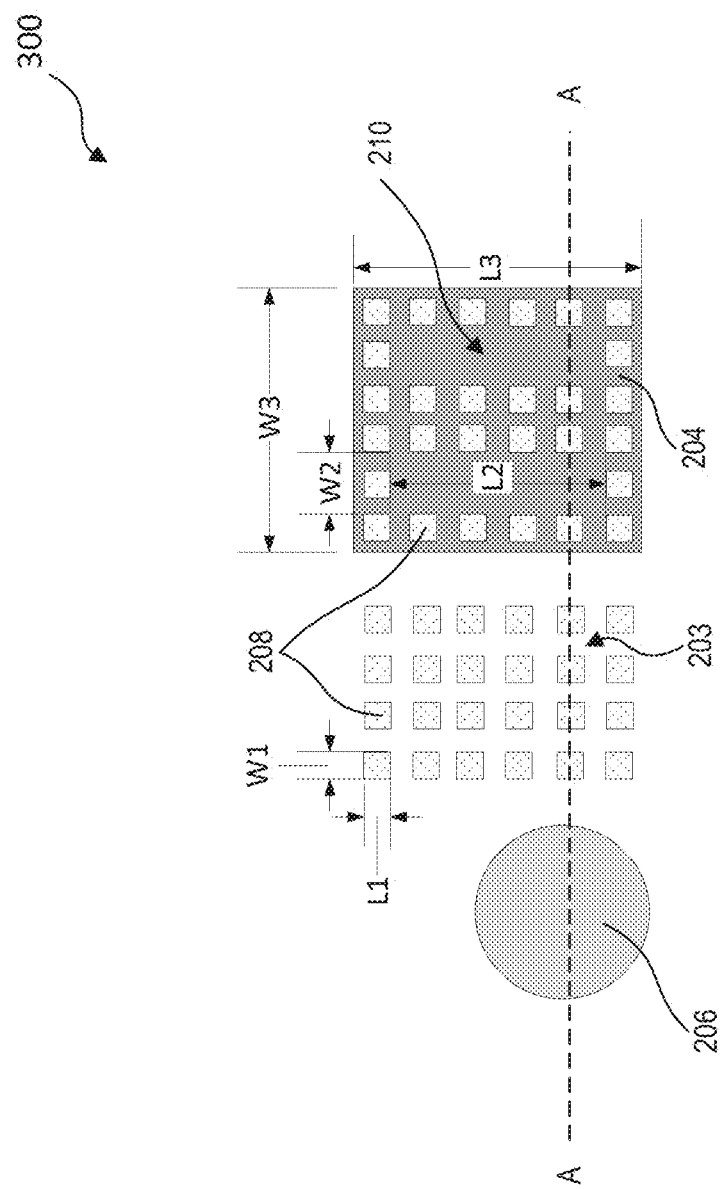
FIG. 3 illustrates a top view of a portion of an image sensor, in accordance with some embodiments.

FIG. 3 illustrates a top view of a portion of image sensor 200, according to some embodiments. In some embodiments, FIG. 3 can be an enlarged view of area 300 in FIG. 2. Area 300 can include pixel 206, extension pad 204, and polysilicon pillars 208. The number of polysilicon pillars 208 can range from about 100 to about 100,000. In some embodiments, polysilicon pillars 208 can be arranged in rows and columns, as shown in FIG. 3. In some embodiments, polysilicon pillars 208 can be arranged in other patterns, such as a concentric pattern, an oval pattern, a trapezoidal pattern, a diamond pattern, and an irregular pattern. Polysilicon pillars 208 can be formed in the area of pixel array 202 that is away from pixels 206, such as area 203. Polysilicon pillars 208 can be formed on extension pad 204. Polysilicon pillars 208 on extension pad 204 can form slot regions 210. Slot regions 210 are away from polysilicon pillars 208 and can be used to electrically connect to interconnect structures and wires. Slot regions 210 are away from polysilicon pillars 208 because polysilicon pillars 208 can reduce contact conductivity between slot regions 210 and the interconnect structures and the wires. For example, slot regions 210 can include a metal, and polysilicon pillars 208 can include a polysilicon material that has a lower conductivity than the metal. If polysilicon pillars 208 are in slot regions 210, the combined conductivity of the polysilicon material and the metal can be lower. Polysilicon pillars 208 in slot regions 210 can also reduce direct contact between slot regions 210 and the interconnect structures and the wires, further reducing contact conductivity.

In some embodiments, polysilicon pillars 208 can have a square or a rectangular cross section. Polysilicon pillars 208 can have a width W1 between about 5 nm and about 10 nm, between about 3 nm and about 15 nm, and between about 1 nm and about 20 nm. Polysilicon pillars 208 can have a length L1 between about 5 nm and about 10 nm, between about 3 nm and about 15 nm, and between about 1 nm and about 20 nm. If W1 or L1 is less than about 1 nm, polysilicon pillars 208 cannot provide sufficient physical support to reduce the CMP nonuniformity of the ILD layer. If W1 or L1 is greater than about 20 nm, polysilicon pillars 208 can consume too much space which can increase the size of image sensor 200. In some embodiments, polysilicon pillars 208 can have other cross-sectional shapes, such as a circular shape, an oval shape, a trapezoidal shape, a diamond shape, and an irregular shape. In some embodiments, polysilicon pillars 208 can have rounded corners between adjacent sidewalls. In some embodiments, polysilicon pillars 208 can have rounded top portions.

In some embodiments, slot regions 210 can be a square or a rectangular region. Slot regions 210 can have a width W2 between about 3 $\mu m$ and about 5 $\mu m$, between about 2 $\mu m$ and about 8 $\mu m$, and between about 1 $\mu m$ and about 10 $\mu m$. Slot regions 210 can have a length L2 between about 50 $\mu M$ and about 60 $\mu M$, between about 40 $\mu m$ and about 70 $\mu M$, and between about 30 $\mu m$ and about 80 $\mu m$. If W2 is less than about 1 $\mu m$ or L2 is less than about 30 $\mu m$, slot regions 210 cannot provide sufficient space for the interconnect structures and the wires. If W2 is greater than about 10 $\mu m$ or L2 is greater than about 80 $\mu m$, slot regions 210 can consume too much space which can increase the size of image sensor 200. In some embodiments, slot regions 210 can have other shapes, such as a circular shape, an oval shape, a trapezoidal shape, a diamond shape, and an irregular shape.

In some embodiments, extension pad 204 can have a square or a rectangular shape. Extension pad 204 can have a width W3 between about 70 µm and about 90 µM, between about 60 µm and about 120 µm, and between about 50 f IM and about 150 µM. Extension pad 204 can have a length L3 between about 70 µm and about 90 µm, between about 60 µm and about 120 µm, and between about 50 µm and about 150 µm. If W3 or L3 is less than about 50 µm, extension pad 204 cannot provide sufficient space for the interconnect structures and the wires. If W3 or L3 is greater than about 150 µM, extension pad 204 can consume too much space which can increase the size of image sensor 200. In some embodiments, extension pad 204 can have other shapes, such as a circular shape, an oval shape, a trapezoidal shape, a diamond shape, and an irregular shape.

Figure 4:
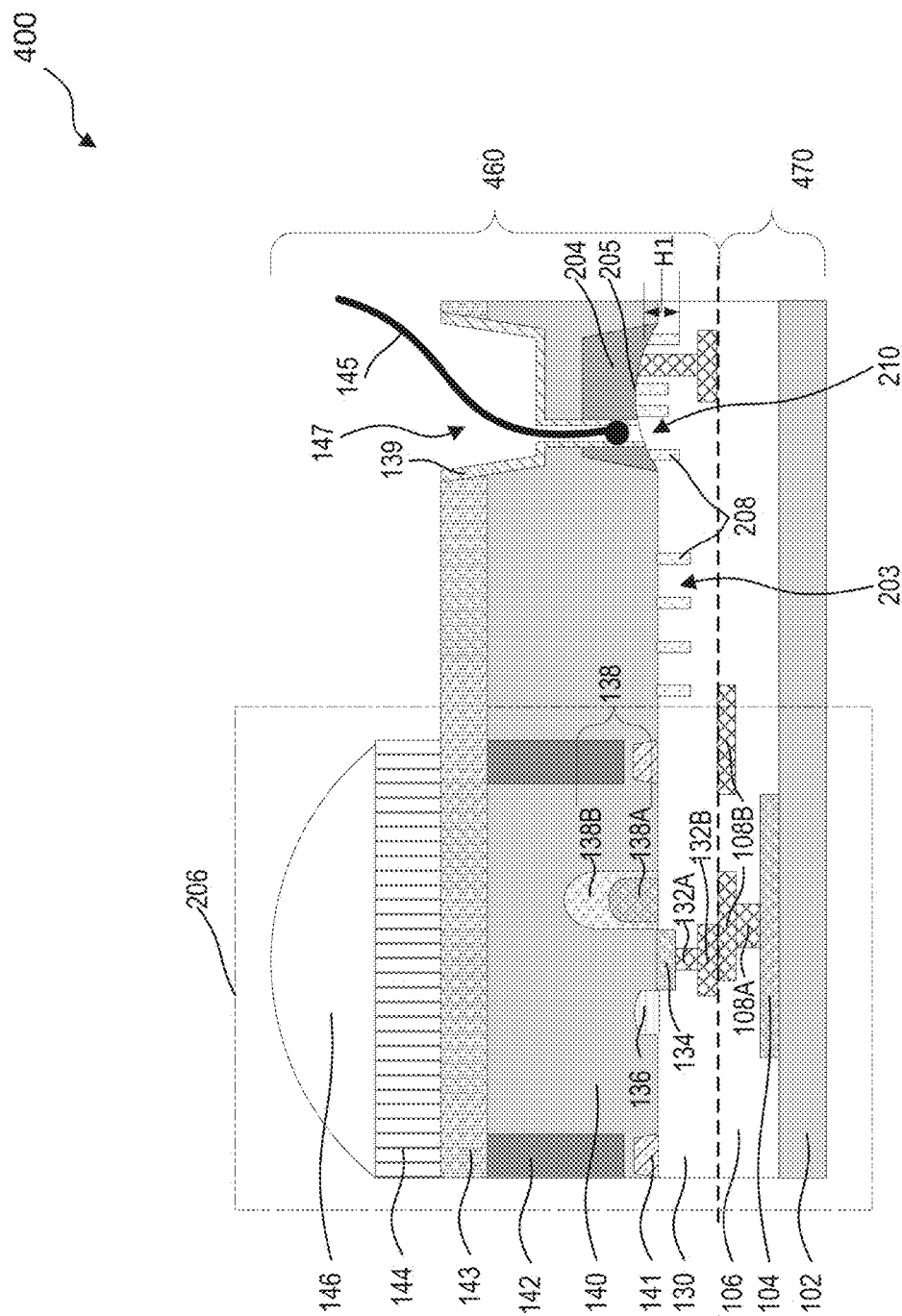
FIG. 4 illustrates a cross-sectional view of an image sensor, in accordance with some embodiments.

FIG. 4 illustrates a cross-sectional view of an image sensor 400, according to some embodiments. In some embodiments, FIG. 4 can be a cross-sectional view of area 300 in FIG. 3 along line A-A. Image sensor 400 can include a first chip 460 and a second chip 470. Second chip 470 is bonded to first chip 460. First chip 460 can include a first substrate 140, a first ILD layer 130, a transfer transistor 134, a diffusion well 136, a photodiode 138, a first interconnect structure including metal vias 132A and metal lines 132B, a deep trench isolation (DTI) structure 142, a STI structure 141, polysilicon pillars 208, an extension pad 204, a passivation layer 143, a barrier layer 139, a wire 145, a wire bonding opening 147, a color filter 144, and a micro lens 146. In some embodiments, first chip 460 can further include a source follower, a reset transistor, a row select transistor, and an in-pixel circuit including a column amplifier and a correlated double sampling (CDS) circuit (not shown in FIG. 4). In some embodiments, the source follower, the reset transistor, the row select transistor, and the in-pixel circuit can be formed on a third chip (not shown in FIG. 4). Second chip 470 can include a second substrate 102, a second ILD layer 106, an application-specific circuit 104, and a second interconnect structure including metal vias 108A and metal lines 108B. Application-specific circuit 104 can include an analog-to-digital converter (ADC), a counter, and a memory storage device.

First substrate 140 and second substrate 102 can be a semiconductor material, such as Si, germanium (Ge), silicon germanium (SiGe), a SOI structure, and combinations thereof. Further, first substrate 140 and second substrate 102 can be doped with p-type dopants, such as boron (B), indium (In), aluminum (Al), and gallium (Ga), or n-type dopants, such as phosphorous (P), and arsenic (As). First substrate 140 can have a height of about 3 µm.

First ILD layer 130, second ILD layer 106, DTI structure 142, STI structure 141, and passivation layer 143 can include an insulating material, such as silicon oxide ($SiO_x$), silicon nitride (SiN), silicon carbon nitride (SiCN), silicon oxycarbon nitride (SiOCN), and silicon germanium oxide ($SiGeO_x$).

Metal vias 132A and 108A and metal lines 132B and 108B can include a suitable conductive material, such as tungsten (W), molybdenum (Mo), nickel (Ni), bismuth (Bi), scandium (Sc), titanium (Ti), copper (Cu), cobalt (Co), silver (Ag), aluminum (Al), titanium aluminum nitride (TiAlN), tantalum carbide (TaC), tantalum carbonitride (TaCN), tantalum silicon nitride (TaSiN), manganese (Mn), zirconium (Zr), titanium nitride (TiN), tantalum nitride (TaN), ruthenium (Ru), tungsten nitride (WN), titanium carbide (TiC), titanium aluminum carbide (TiAlC), tantalum aluminum carbide (TaAlC), metal alloys, and combinations thereof. The first interconnect structure including metal vias 132A and metal lines 132B and the second interconnect structure including metal vias 108A and metal lines 108B can electrically couple first chip 460 to second chip 470.

Barrier layer 139 can include any suitable materials, such as a metal oxide ($MO_x$), a metal nitride ($MN_x$), a metal carbide (MG), a metalaluminate ($MAl_xO_y$), a combination of metal oxides ($M1O_x/M2O_x$), a metal-silicate ($MSiO_x$), and combinations thereof. In some embodiments, the metal in the above-mentioned materials is a transition metal, such as hafnium (Hf), Zr, Ti, and Al, a rare earth metal, such as yttrium (Y), ytterbium (Yb), erbium (Er), and combinations thereof. In some embodiments, barrier layer 139 can include dielectric materials, such as SiN, SiOCN, SiCN, other suitable insulating materials, and combination thereof. In some embodiments, the thickness of barrier layer 139 can be between about 1 nm and about 10 nm.

Transfer transistor 134 and application-specific circuit 104 can include a gate structure. The gate structure can include multiple layers (not shown in FIG. 4). The gate structure can include an interfacial oxide (TO) layer (not shown in FIG. 4), a high-k (HK) dielectric layer (not shown in FIG. 4) disposed on the JO layer, and a conductive layer (not shown in FIG. 4) disposed on the HK dielectric layer. The IO layer can include $SiO_x$, $SiGeO_x$, and $GeO_x$. The HK dielectric layer can include a HK dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). The HK dielectric layer can have a thickness between about 1 nm and about 10 nm. The conductive layer can have multiple layers (not shown in FIG. 4). The conductive layer can include a work function metal (WFM) layer disposed on the HK dielectric layer and a metal fill layer disposed on the WFM layer. In some embodiments, the WFM layer can include titanium aluminum (TiAl), TiAlC, tantalum aluminum (TaAl), TaAlC, Al-doped Ti, Al-doped TiN, Al-doped tantalum Ta, Al-doped TaN, other suitable Al-based materials, substantially Al-free (e.g., with no Al) Ti-based or Ta-based nitrides or alloys, such as TiN, titanium silicon nitride (TiSiN), titanium gold (Ti—Au) alloy, titanium copper (Ti—Cu) alloy, TaN, TaSiN, tantalum gold (Ta—Au) alloy, tantalum copper (Ta—Cu) alloy, and combinations thereof. The metal fill layer can include a suitable conductive material, such as W, low-fluorine tungsten (LFW), Ti, Ag, Ru, Mo, Cu, Co, Al, iridium (Ir), nickel (Ni), metal alloys, and combinations thereof. The metal fill layer can have a thickness between about 2 nm and about 100 nm. The gate structure can have gate contacts (not shown in FIG. 4) that include a suitable conductive material, such as W. The gate structure can be a planar gate structure or a fin field effect transistor (finFET). Application-specific circuit 104 can include circuit elements other than a transistor.

Diffusion well 136 can be a doped region disposed in substrate 140 that functions as a source/drain (S/D) region. Diffusion well 136 can include a semiconductor material, such as Si and SiGe. Diffusion well 136 can be doped with p-type dopants, such as B and other suitable p-type dopants. Diffusion well 136 can be doped with n-type dopants, such as P and other suitable n-type dopants. A dopant concentration of diffusion well 136 can be in a range from about $1\times10^{20}$ atoms/cm$^3$ to about $3\times10^{22}$ atoms/cm$^3$. In some embodiments, diffusion well 136 can have a depth of about 50 nm to about 70 nm. Diffusion well 136 can be adjacent to transfer transistor 134. Application-specific circuit 104 can include S/D regions (not shown in FIG. 4) similar to diffusion well 136. Application-specific circuit 104 can further include S/D contacts (not shown in FIG. 4) on the S/D regions. The S/D contacts can include a suitable conductive material, such as W.

Photodiode 138 can include two oppositely-doped regions disposed in substrate 140. For example, photodiode 138 can include a first doped region 138A and a second doped region 138B. First doped region 138A and second doped region 138B can include a semiconductor material, such as Si and SiGe. First doped region 138A can be n-doped and second doped region 138B can be p-doped. Alternatively, first doped region 138A can be p-doped and second doped region 138B can be n-doped. N-doped regions can be doped with n-type dopants, such as P and other suitable n-type dopants. P-doped regions can be doped with p-type dopants, such as B and other suitable n-type dopants. A dopant concentration of first doped region 138A and second doped region 138B can be in a range from about $1\times10^{20}$ atoms/cm$^3$ to about $3\times10^{22}$ atoms/cm$^3$, from about $0.8\times10^{20}$ atoms/cm$^3$ to about $3.3\times10^{22}$ atoms/cm$^3$, and from about $0.5\times10^{20}$ atoms/cm$^3$ to about $3.5\times10^{22}$ atoms/cm$^3$. If the dopant concentration is less than about $0.5\times10^{20}$ atoms/cm$^3$, photodiode 138 cannot effectively sense radiation. Photodiode 138 cannot effectively sense radiation if the total generated photocurrent density is below about 10 nA/cm$^2$. If the dopant concentration is greater than about $3.5\times10^{22}$ atoms/cm$^3$, the manufacturing cost of forming photodiode 138 can be too high.

Polysilicon pillars 208 can include a polysilicon material. In some embodiments, polysilicon pillars 208 can include other materials, such as a dielectric material, a metal, and a metal compound. Polysilicon pillars 208 can be formed in an area that is away from pixels 206, such as area 203. ILD layer 130 deposited in area 203 has less physical support from pixels 206 and would polish faster. Polysilicon pillars 208 can be formed on extension pad 204. ILD layer 130 deposited on extension pad 204 has less physical support because of curved surface 205 of extension pad 204 and would polish faster. Polysilicon pillars 208 can provide structural support for ILD layer 130 deposited in area 203 and on extension pad 204. Polysilicon pillars 208 can reduce the polishing speed of ILD layer 130 deposited in area 203 and on extension pad 204. Consequently, polysilicon pillars 208 can improve the polishing uniformity of ILD layer 130 across image sensor 400. In some embodiments, a distance between a highest point on the polished ILD layer 130 and a lowest point on the polished ILD layer 130 can be less than about 400 nm. Polysilicon pillars 208 on extension pad 204 can form slot regions 210. Slot regions 210 are away from polysilicon pillars 208 and can be used to electrically connect to the first interconnect structure, including metal vias 132A and metal lines 132B and wire 145.

Polysilicon pillars 208 can have a height H1 between about 600 nm and about 800 nm, between about 400 nm and about 1000 nm, and between about 200 nm and about 1200 nm. If H1 is less than about 200 nm, polysilicon pillars 208 cannot provide sufficient physical support to reduce the CMP nonuniformity of ILD layer 130. If H1 is greater than about 1200 nm, polysilicon pillars 208 can consume too much space which can increase the size of image sensor 400.

Extension pad 204 can include a suitable conductive material, such as W, Ti, Ag, Ru, Mo, Cu, Co, Al, Ir, Ni, metal alloys, and combinations thereof. Extension pad 204 can have a height of about 1 μm. Extension pad 204 can have curved surface 205 with a curvature between about 0.05 μm$^{-1}$ and about 1 μm$^{-1}$. Curved surface 205 can be formed during formation of extension pad 204. The curvature of curved surface 205 can increase during the formation of STI structure 141. Without polysilicon pillars 208, curved surface 205 can cause high nonuniformity of ILD layer 130 after CMP. Polysilicon pillars 208 on extension pad 204 can increase the polishing uniformity of ILD layer 130. The uniform ILD layer 130 can reduce electrical connection failures of the first interconnect structure including metal vias 132A and 132B. The uniform ILD layer 130 can also reduce bonding failures after first chip 460 is bonded to second chip 470. The decreased electrical connection failures and the decreased bonding failures can improve device performance and reliability.

Wire 145 can include a suitable conductive material, such as W, Ti, Ag, Ru, Mo, Cu, Co, Al, Ir, Ni, metal alloys, and combinations thereof. Wire 145 can be bonded to extension pad 204. Wire 145 can be bonded to slot region 210 of extension pad 204. Wire 145 can be placed in wire bonding opening 147. Wire bonding opening 147 can be formed through passivation layer 143, first substrate 140, and extension pad 204. Barrier layer 139 can be disposed in wire bonding opening 147. In some embodiments, wire bonding opening 147 can be filled with a solder bump (not shown in FIG. 4).

Color filter 144 can include a color photoresist disposed on passivation layer 143. The color photoresist can include pigments or dyes. Color filter 144 can transmit radiation having wavelengths within a range. For example, color filter 144 can pass red, blue, or green light to photodiode 138. In some embodiments, color filter 144 across image sensor 400 can transmit radiation having the same wavelength. In some embodiments, color filter 144 across image sensor 400 can transmit radiation having different wavelengths. In some embodiments, there can be a grid structure (not shown in FIG. 4) surrounding color filter 144. In some embodiments, the grid structure can have rounded corners between adjacent sidewalls. In some embodiments, the grid structure can have rounded top portions.

Micro lens 146 can include a polymer material with a round shape and disposed on color filter 144. Micro lens 146 can focus the incident radiation towards photodiode 138.

Figure 5A:
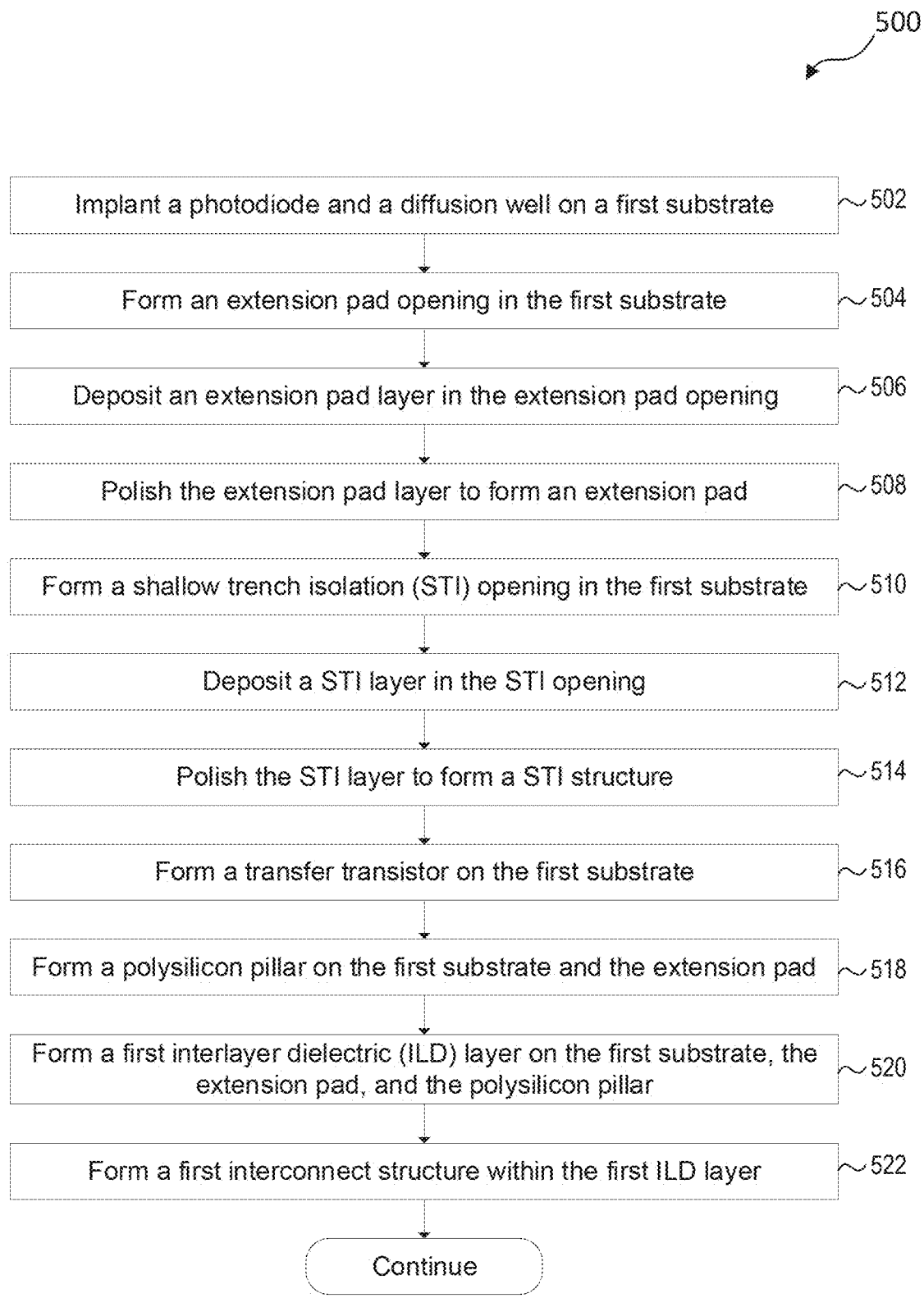
FIGS. 5A and 5B are a flow diagram of a method for fabricating an image sensor, in accordance with some embodiments.
Figure 5B:
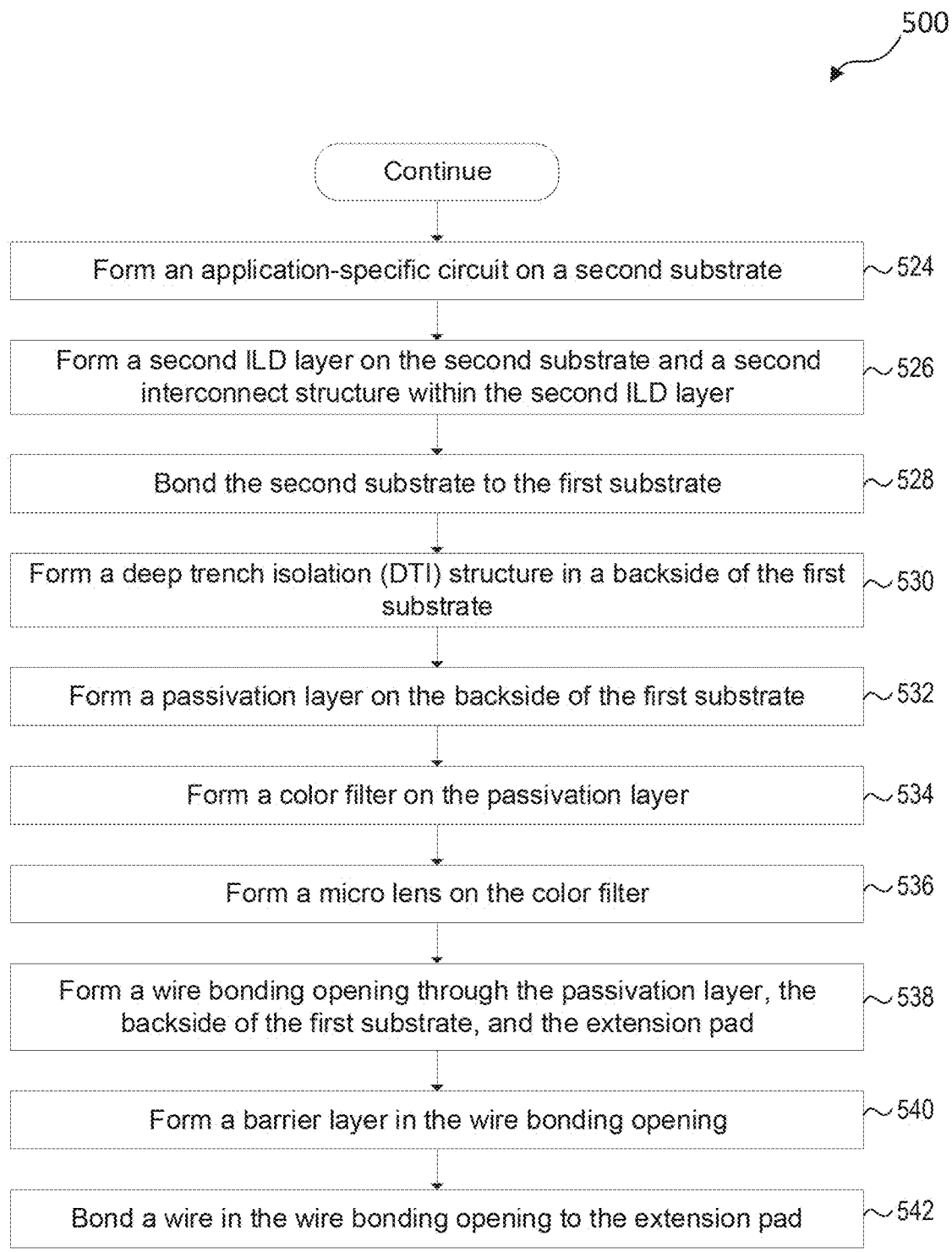

FIGS. 5A and 5B are a flow diagram of a method 500 for fabricating image sensor 400 as shown in FIG. 4, according to some embodiments. For illustrative purposes, the operations illustrated in FIGS. 5A and 5B will be described with reference to the example fabrication process for fabricating image sensor 400 as illustrated in FIGS. 6-26. FIGS. 6-26 are cross-sectional views of image sensor 400 at various stages of fabrication, according to some embodiments. Additional fabrication operations can be performed between the various operations of method 500 and are omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIGS. 5A and 5B. Elements in FIGS. 6-26 with the same annotations as the elements in FIGS. 2-4 are described above. It should be noted that method 500 may not produce a complete image sensor 400. Accordingly, it is understood that additional processes can be provided before, during, and after method 500, and that some other processes may only be briefly described herein.

Figure 6:
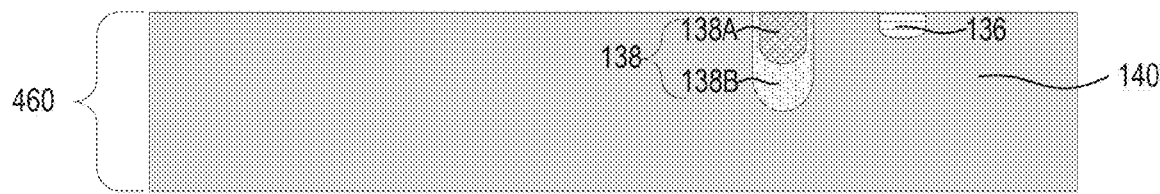

Referring to FIG. 5A, in operation 502, a photodiode and a diffusion well corresponding to the photodiode are implanted in a first substrate. For example, as shown in FIG. 6, photodiode 138 and diffusion well 136 can be implanted in first substrate 140. Diffusion well 136 and second doped region 138B of photodiode 138 can be implanted in first substrate 140. First doped region 138A of photodiode 138 can be implanted in second doped region 138B. The implantation dopant species can be an n-type dopant, such as P and As, or a p-type dopant, such as B, In, Al, Ga, and combinations thereof. The ion beam energy can be between about 0.5 keV and about 15 keV. The dose of the dopants can be between about $0.5 \times 10^{15}$ ions/cm$^2$ and about $1.5 \times 10^{16}$ ions/cm$^2$. The tilt angle for the ion beam can be between about 0° and about 30°. The twist angle for the ion beam can be flexible. In some embodiments, a post-implantation anneal can be performed.

Figure 7:
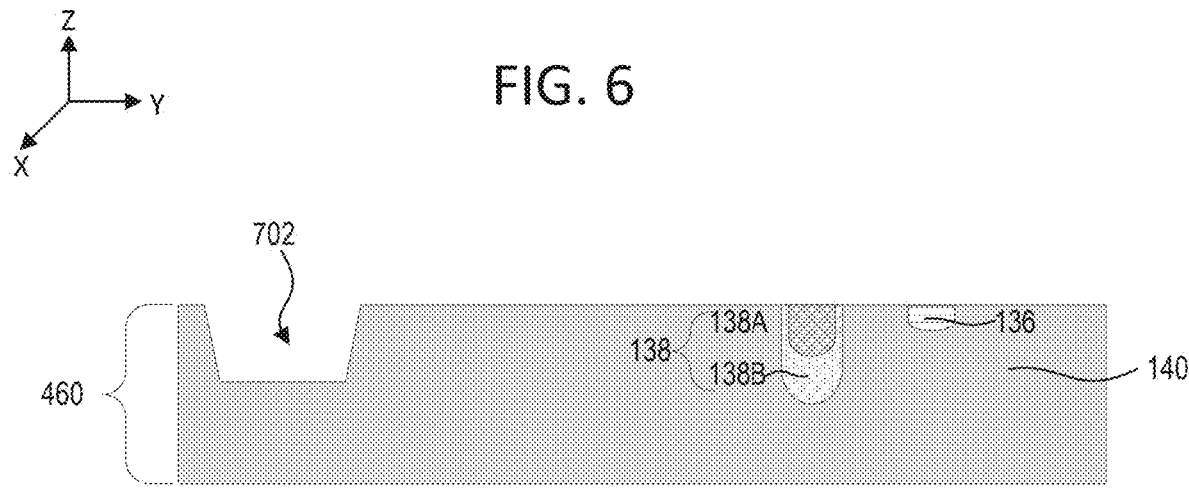

Referring to FIG. 5A, in operation 504, an extension pad opening is formed in the first substrate. For example, as shown in FIG. 7, extension pad opening 702 can be formed in first substrate 140. In some embodiments, extension pad opening 702 can be formed by a dry etch process or a wet etch process. In some embodiments, the dry etch process can include etchants with an (i) oxygen-containing gas; (ii) methane (CH$_4$); (iii) a fluorine-containing gas (e.g., carbon tetrafluoride (CF$_4$), sulfur hexafluoride (SF$_6$), difluoromethane (CH$_2$F$_2$), trifluoromethane (CHF$_3$), and/or hexafluoroethane (C$_2$F$_6$)); (iv) a chlorine-containing gas (e.g., chlorine (Cl$_2$), chloroform (CHCl$_3$), carbon tetrachloride (CCl$_4$), and/or boron trichloride (BCl$_3$)); (v) a bromine-containing gas (e.g., hydrogen bromide (HBr) and/or bromoform (CHBr$_3$)); (vi) an iodine-containing gas; (vii) other suitable etching gases and/or plasmas; or combinations thereof. In some embodiments, the wet etch process can include etching in diluted hydrofluoric acid (DHF), potassium hydroxide (KOH) solution, ammonia, a solution containing hydrofluoric acid (HF), nitric acid (HNO$_3$), acetic acid (CH$_3$COOH), or combinations thereof. In some embodiments, the area to be etched to form extension pad opening 702 can be defined by a photolithography process. The etch process to form extension pad opening 702 can be a timed etch.

Figure 8:
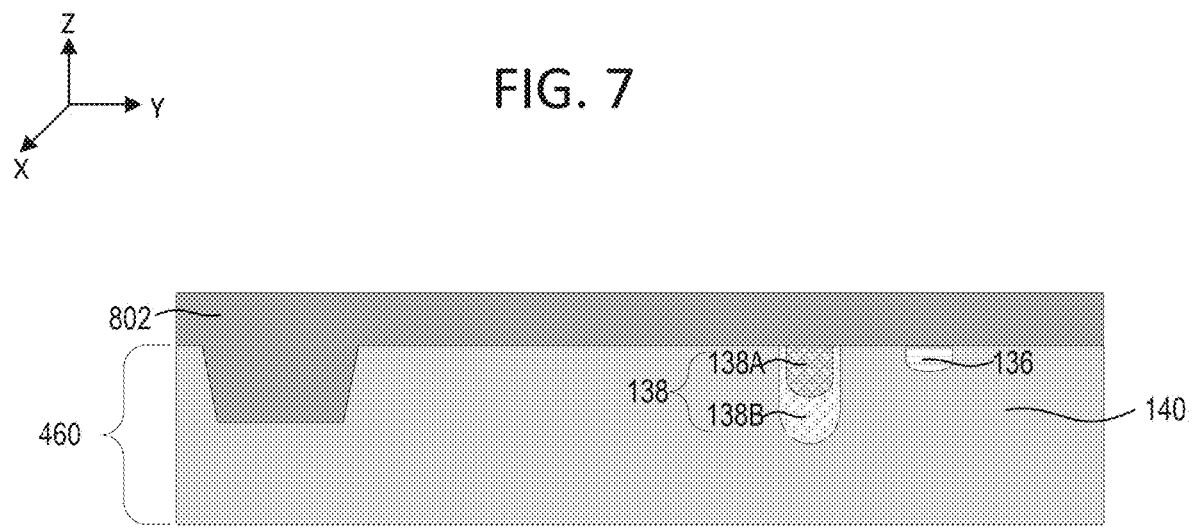

Referring to FIG. 5A, in operation 506, an extension pad layer is deposited in the extension pad opening. For example, as shown in FIG. 8, extension pad layer 802 can be deposited in extension pad opening 702. Extension pad layer 802 can be deposited by a chemical vapor deposition (CVD) process, a metal-organic chemical vapor deposition (MOCVD) process, a physical vapor deposition (PVD) process, or a sputtering process.

Figure 9:
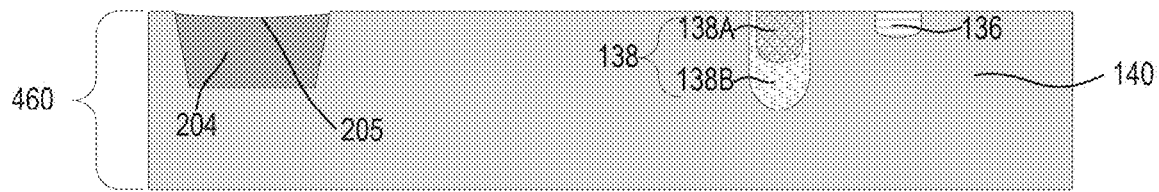

Referring to FIG. 5A, in operation 508, the extension pad layer is polished to form an extension pad. For example, as shown in FIG. 9, extension pad layer 802 above a top surface of first substrate 140 can be polished to form extension pad 204. Extension pad layer 802 can be polished by a CMP process. Because of the large size of extension pad 204, a curved surface 205 can be formed after the CMP process.

Figure 10:
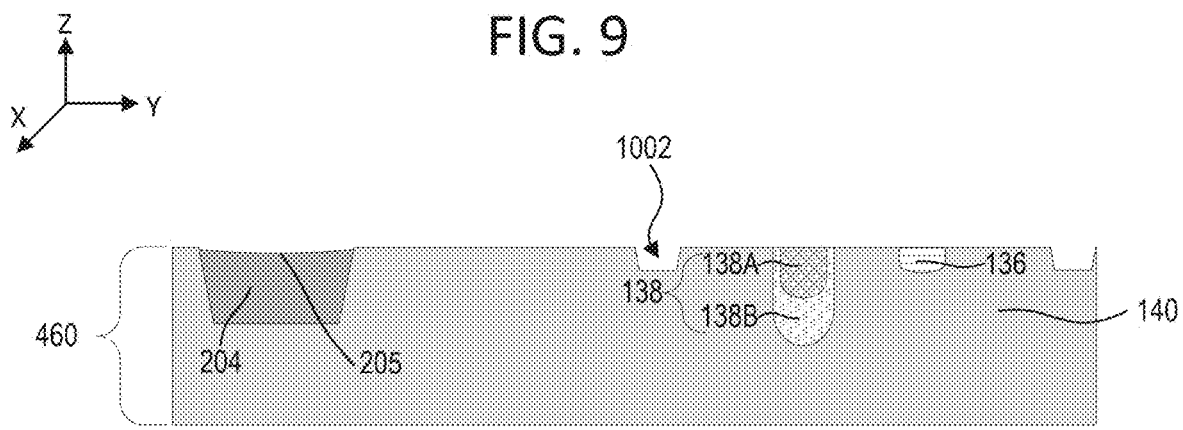

Referring to FIG. 5A, in operation 510, a STI opening is formed in the first substrate. For example, as shown in FIG. 10, STI opening 1002 can be formed in first substrate 140. In some embodiments, STI opening 1002 can be formed by a dry etch process or a wet etch process in a manner similar to that described with reference to FIG. 7 and operation 504 of FIG. 5A.

Figure 11:
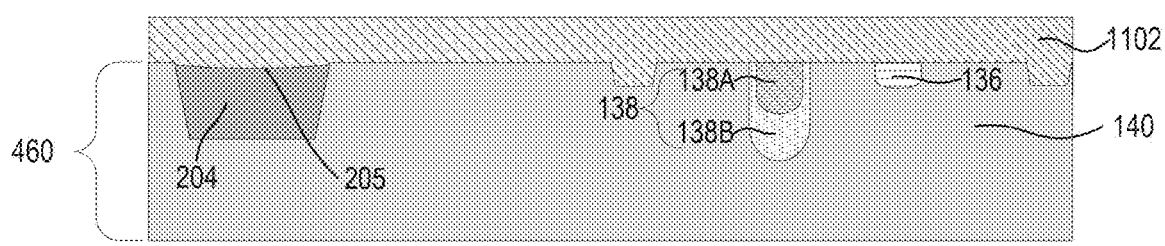

Referring to FIG. 5A, in operation 512, a STI layer is deposited in the STI opening. For example, as shown in FIG. 11, STI layer 1102 can be deposited in STI opening 1002. STI layer 1102 can be deposited by a CVD process or a PVD process.

Figure 12:
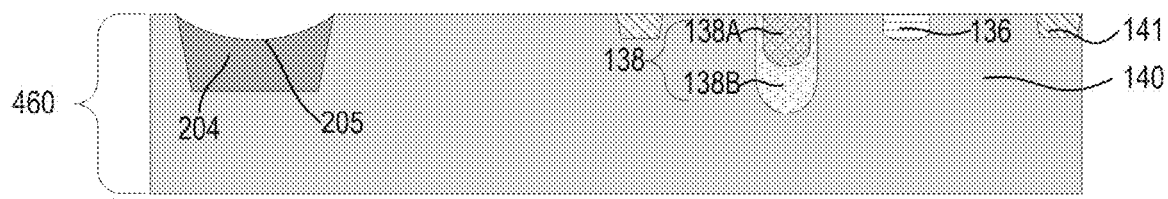

Referring to FIG. 5A, in operation 514, the STI layer is polished to form a STI structure. For example, as shown in FIG. 12, STI layer 1102 above a top surface of first substrate 140 can be polished to form STI structure 141. STI layer 1102 can be polished by a CMP process. After the CMP process to form STI structure 141, a curvature of curved surface 205 of extension pad 204 can increase.

Figure 13:
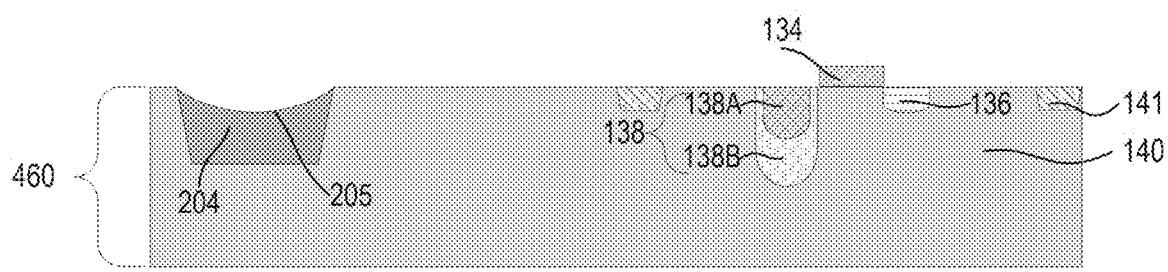

Referring to FIG. 5A, in operation 516, a transfer transistor is formed on the first substrate. For example, as shown in FIG. 13, transfer transistor 134 can be formed on first substrate 140 and adjacent to diffusion well 136 and photodiode 138. The area to form transfer transistor 134 can be patterned by a photolithography process. In some embodiments, an IO layer (not shown in FIG. 13) of transfer transistor 134 can be formed by a CVD process or a PVD process. A HK dielectric layer (not shown in FIG. 13) of transfer transistor 134 can be deposited by a CVD process or a PVD process. A WFM layer (not shown in FIG. 13) of transfer transistor 134 can be deposited by a CVD process, a PVD process, or a MOCVD process. A metal fill layer (not shown in FIG. 13) of transfer transistor 134 can be deposited by a CVD process, a PVD process, or a MOCVD process. In some embodiments, a source follower, a reset transistor, a row select transistor, and an in-pixel circuit (not shown in FIG. 13) can be formed on first substrate 140 in a manner similar to the formation of transfer transistor 134. In some embodiments, the source follower, the reset transistor, the row select transistor, and the in-pixel circuit can be formed on a different substrate from first substrate 140. The different substrate can be bonded to first substrate 140.

Figure 14:
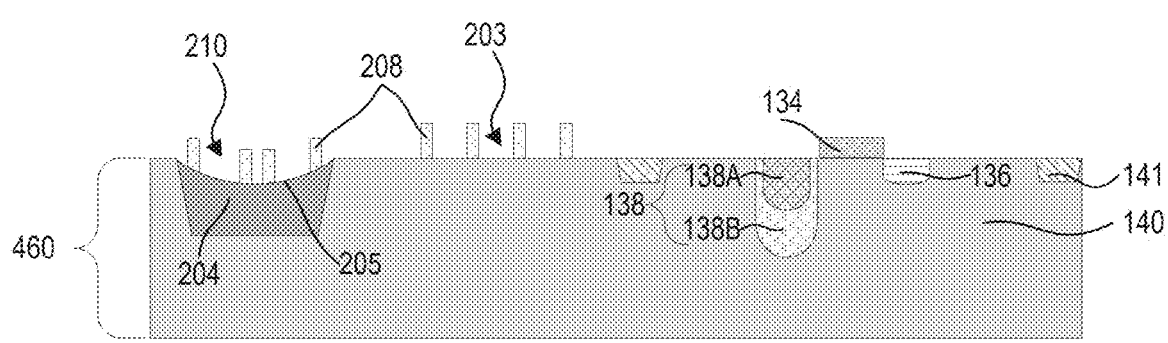

Referring to FIG. 5A, in operation 518, polysilicon pillars are formed on the first substrate and the extension pad. For example, as shown in FIG. 14, polysilicon pillars 208 can be formed on extension pad 204 and on first substrate 140 in an area that is away from photodiode 138. In some embodiments, polysilicon pillar openings can be patterned by a photolithography process. Polysilicon pillars 208 can be formed in the polysilicon pillar openings. In some embodiments, a blanket polysilicon pillar layer can be deposited on extension pad 204 and on first substrate 140 in area 203 that is away from photodiode 138. Portions of the polysilicon pillar layer can be etched by a dry etch process or a wet etch process to form polysilicon pillars 208. Portions of the polysilicon pillar layer can be etched in a manner similar to that described with reference to FIG. 7 and operation 504 of FIG. 5A. Polysilicon pillars 208 can be patterned to form slot regions 210 to be used for interconnect structure connections and wire bonding.

Figure 15:
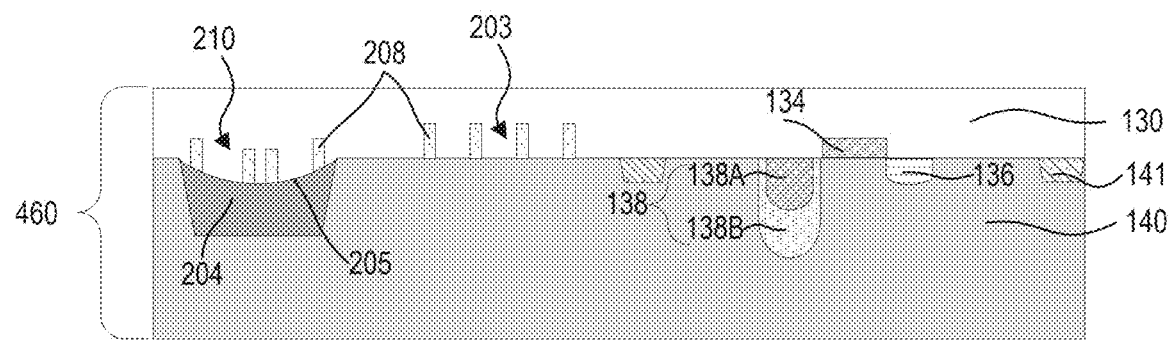

Referring to FIG. 5A, in operation 520, a first ILD layer is formed on the first substrate, the extension pad, and the polysilicon pillars. For example, as shown in FIG. 15, first ILD layer 130 can be formed on first substrate 140, extension pad 204, and polysilicon pillars 208. A dielectric material can be blanket deposited on first substrate 140, extension pad 204, and polysilicon pillars 208 by a CVD process. The dielectric material can be polished by a CMP process to form first ILD layer 130. Without polysilicon pillars 208, curved surface 205 can cause high nonuniformity of first ILD layer 130 after CMP. Polysilicon pillars 208 on extension pad 204 can increase the polishing uniformity of first ILD layer 130. The uniform first ILD layer 130 can reduce electrical connection failures of the first interconnect structure including metal vias 132A and 132B. The uniform first ILD layer 130 can also reduce bonding failures after first chip 460 is bonded to second chip 470. The decreased electrical connection failures and the decreased bonding failures can improve device performance and reliability.

Figure 16:
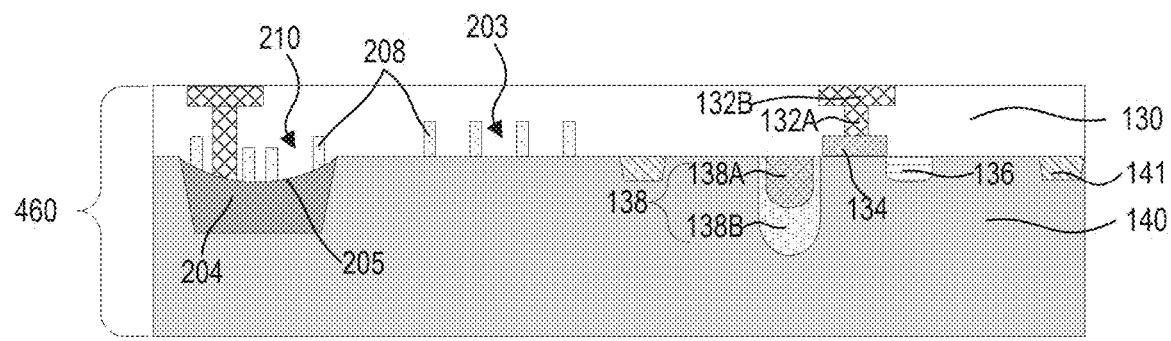

Referring to FIG. 5A, in operation 522, a first interconnect structure is formed within the first ILD layer. For example, as shown in FIG. 16, a first interconnect structure including metal vias 132A and metal lines 132B can be formed within first ILD layer 130. Metal via openings and metal line openings can be formed within first ILD layer 130 and on transfer transistor 134 and extension pad 204 by a dry etch process (e.g., reactive ion etch process) using a fluorocarbon ($C_xF_y$) gas. The uniform first ILD layer 130 can improve etching reliability by reducing disconnected metal line openings to metal via openings. Metal vias 132A and metal lines 132B can be deposited in the metal via openings and metal line openings by a sputtering process, an electroplating process, a PVD process, a CVD process, a plasma-enhanced chemical vapor deposition (PECVD) process, or a MOCVD process. Metal vias 132A and metal lines 132B can be deposited in slot regions 210 of extension pad 204. In some embodiments, barrier layers (not shown in FIG. 16) can be deposited by a CVD process or an atomic layer deposition (ALD) process before metal vias 132A and metal lines 132B are formed.

Figure 17:

Referring to FIG. 5B, in operation 524, an application-specific circuit is formed on a second substrate. For example, as shown in FIG. 17, application-specific circuit 104 can be formed on second substrate 102. S/D regions (not shown in FIG. 17) can be implanted in second substrate 102 adjacent to application-specific circuit 104 in a manner similar to that described with reference to FIG. 6 and operation 502 of FIG. 5A. Different layers of application-specific circuit 104 can be deposited in a manner similar to that described with reference to FIG. 13 and operation 516 of FIG. 5A. In some embodiments, application-specific circuit 104 can include circuit elements other than a transistor. In some embodiments, operation 524 can further include processes to form such circuit elements.

Figure 18:

Referring to FIG. 5B, in operation 526, a second ILD layer is formed on the second substrate and a second interconnect structure is formed within the second ILD layer. For example, as shown in FIG. 18, second ILD layer 106 can be formed on second substrate 102 and a second interconnect structure including metal vias 108A and metal lines 108B can be formed within second ILD layer 106. Second ILD layer 106 can be formed in a manner similar to that described with reference to FIG. 15 and operation 520 of FIG. 5A. Metal vias 108A and metal lines 108B can be formed in a manner similar to that described with reference to FIG. 16 and operation 522 of FIG. 5A.

Figure 19:
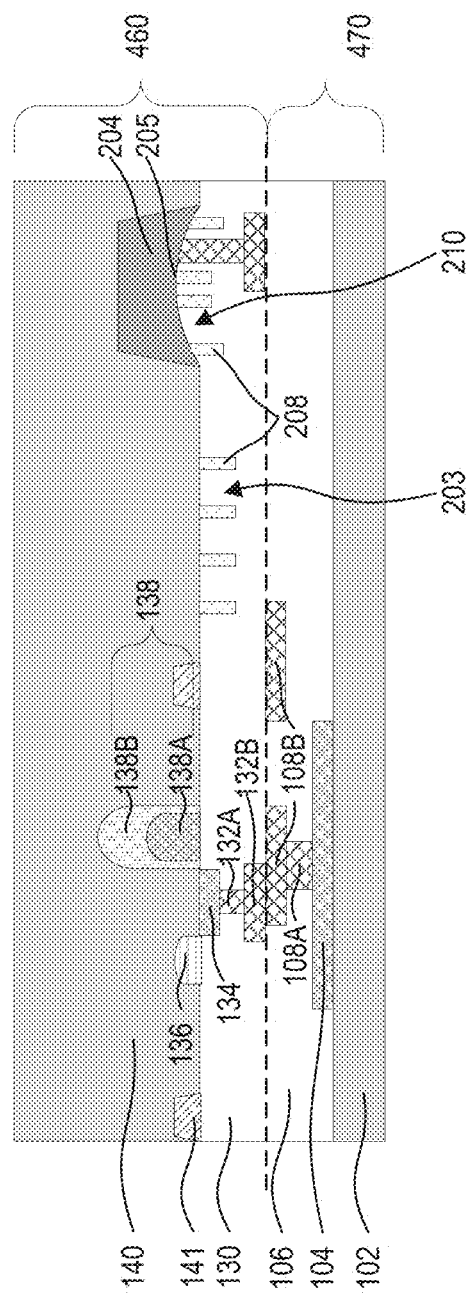
Figure 19:
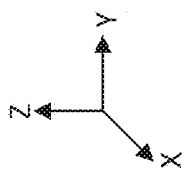

Referring to FIG. 5B, in operation 528, the second substrate is bonded to the first substrate. For example, as shown in FIG. 19, second chip 470 can be bonded to first chip 460. First chip 460 can be flipped over and bonded to second chip 470 by a fusion bonding process, a hybrid bonding process, an anodic bonding process, a direct bonding process, or other suitable bonding processes. Portions of the first interconnect structure and portions of the second interconnect structure can be in contact to electrically couple first chip 460 to second chip 470. The uniform first ILD layer 130 can improve bonding reliability by reducing gaps between first ILD layer 130 and second ILD layer 106.

Figure 20:
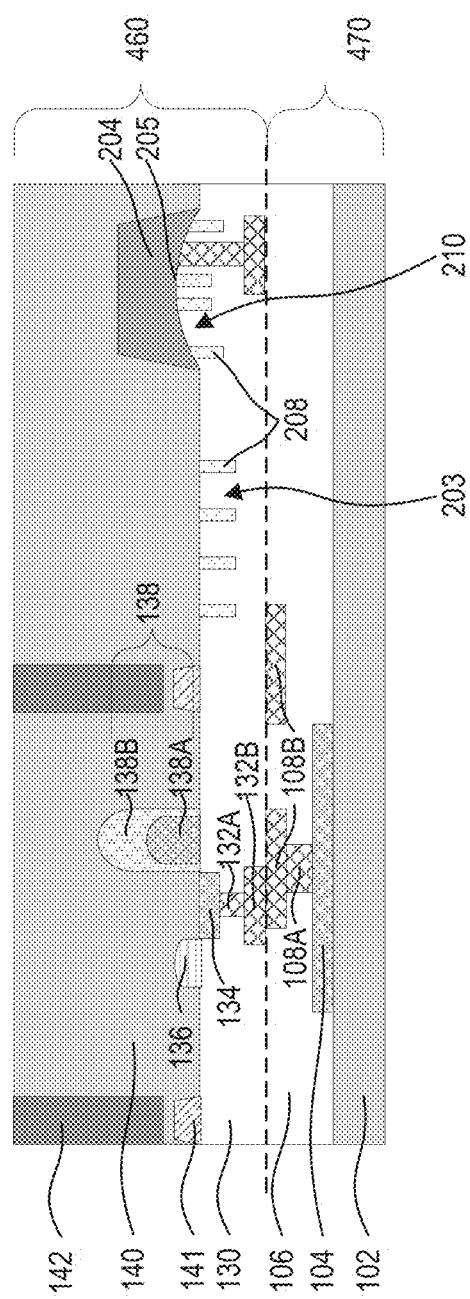

Referring to FIG. 5B, in operation 530, a DTI structure is formed in a backside of the first substrate. For example, as shown in FIG. 20, DTI structure 142 can be formed in a backside of first substrate 140. A DTI opening can be formed in first substrate 140 by a dry etch process or a wet etch process in a manner similar to that described with reference to FIG. 7 and operation 504 of FIG. 5A. DTI structure 142 can be deposited in the DTI opening by a CVD process and polished by a CMP process. In some embodiments, DTI structure 142 and first substrate 140 can be thinned by a CMP process. DTI structure 142 can be formed to separate photodiode 138 from adjacent photodiodes.

Figure 21:
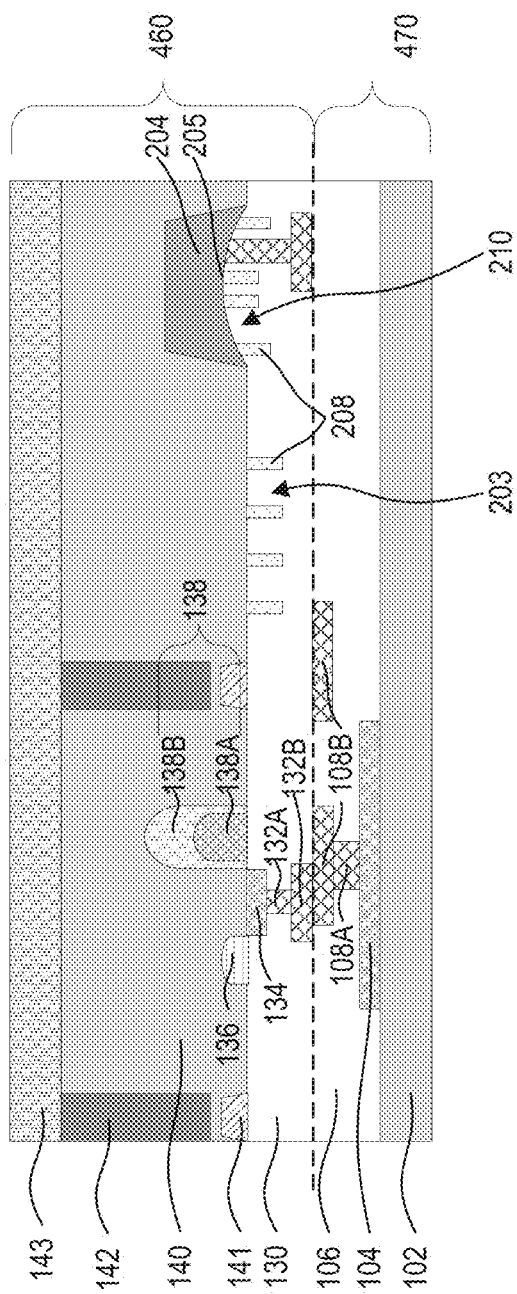

Referring to FIG. 5B, in operation 532, a passivation layer is formed on the backside of the first substrate. For example, as shown in FIG. 21, passivation layer 143 can be formed on the backside of first substrate 140. Passivation layer 143 can be deposited on the backside of first substrate 140 by a CVD process or a PVD process and polished by a CMP process.

Referring to FIG. 5B, in operation 534, a color filter is formed on the passivation layer. For example, as shown in FIG. 22, color filter 144 can be formed on passivation layer 143. A color filter layer, such as a color photoresist, can be spin-coated on passivation layer 143. The color photoresist can be patterned by a photolithography process. The color photoresist can be exposed to an ultraviolet (UV) or an extreme ultraviolet (EUV) light source through a photomask, such as a reticle. The exposed color photoresist can be developed by a developer chemical. In some embodiments, the developed color photoresist can be baked to improve the durability of color filter 144. An array of color filters 144 can be formed on each image sensing element of an array of image sensing elements or pixels.

Figure 23:
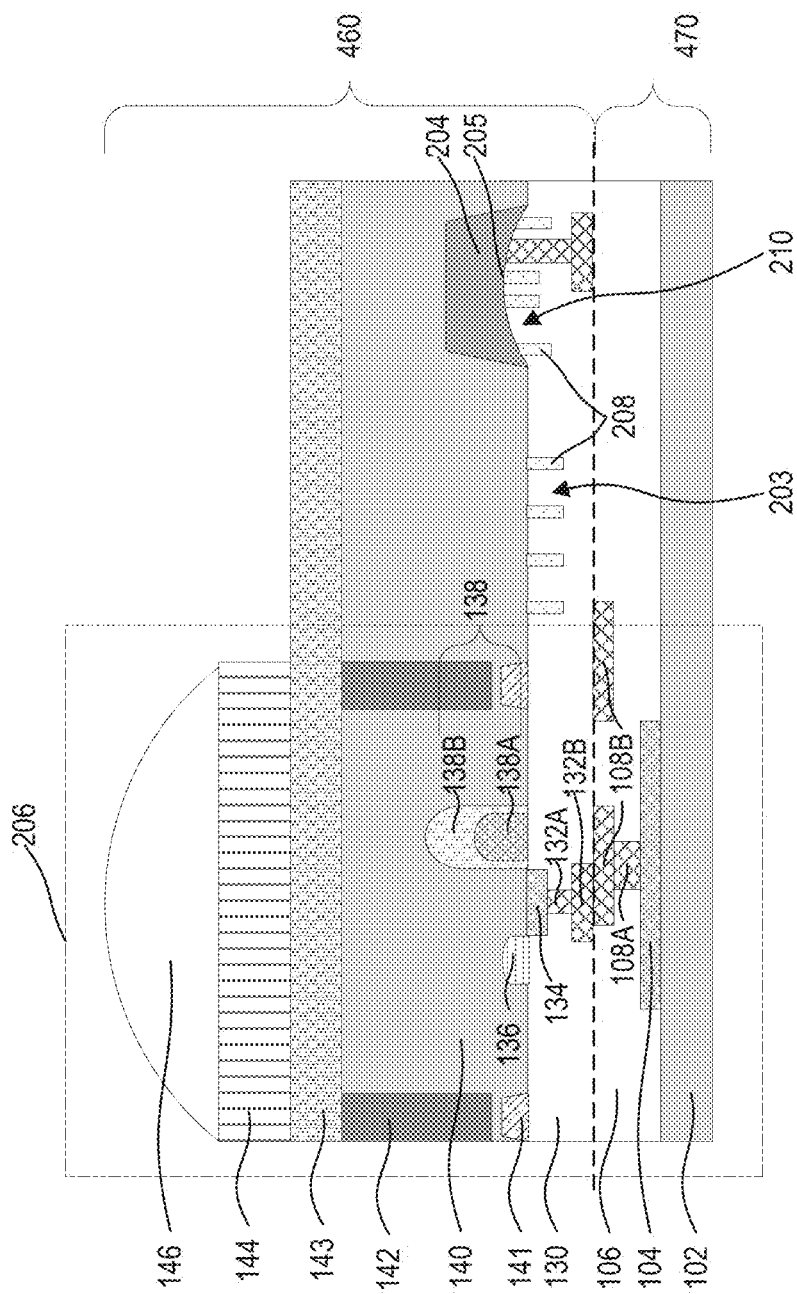

Referring to FIG. 5B, in operation 536, a micro lens is formed on the color filter. For example, as shown in FIG. 23, micro lens 146 can be formed on color filter 144. A micro lens layer, such as an acrylic-based photoresist, a polyimide photoresist, an epoxy photoresist, polyorganosiloxane, and polyorganosilicate, can be spin-coated on color filter 144. The micro lens layer can be patterned by a photolithography process. The micro lens layer can be exposed to an ultraviolet (UV) or an extreme ultraviolet (EUV) light source through a photomask, such as a reticle. The intensity of the UV or EUV light source can vary across each micro lens. For example, for a negative photoresist, more light can be exposed near the side of the micro lens and less light can be exposed near the center of the micro lens. The varying intensity of the light source can form the micro lens with a curved upper surface. The exposed micro lens layer can be developed by a developer chemical. In some embodiments, the developed micro lens layer can be baked to improve the durability of micro lens 146. An array of micro lenses 146 can be formed on the array of color filters 144.

Figure 24:
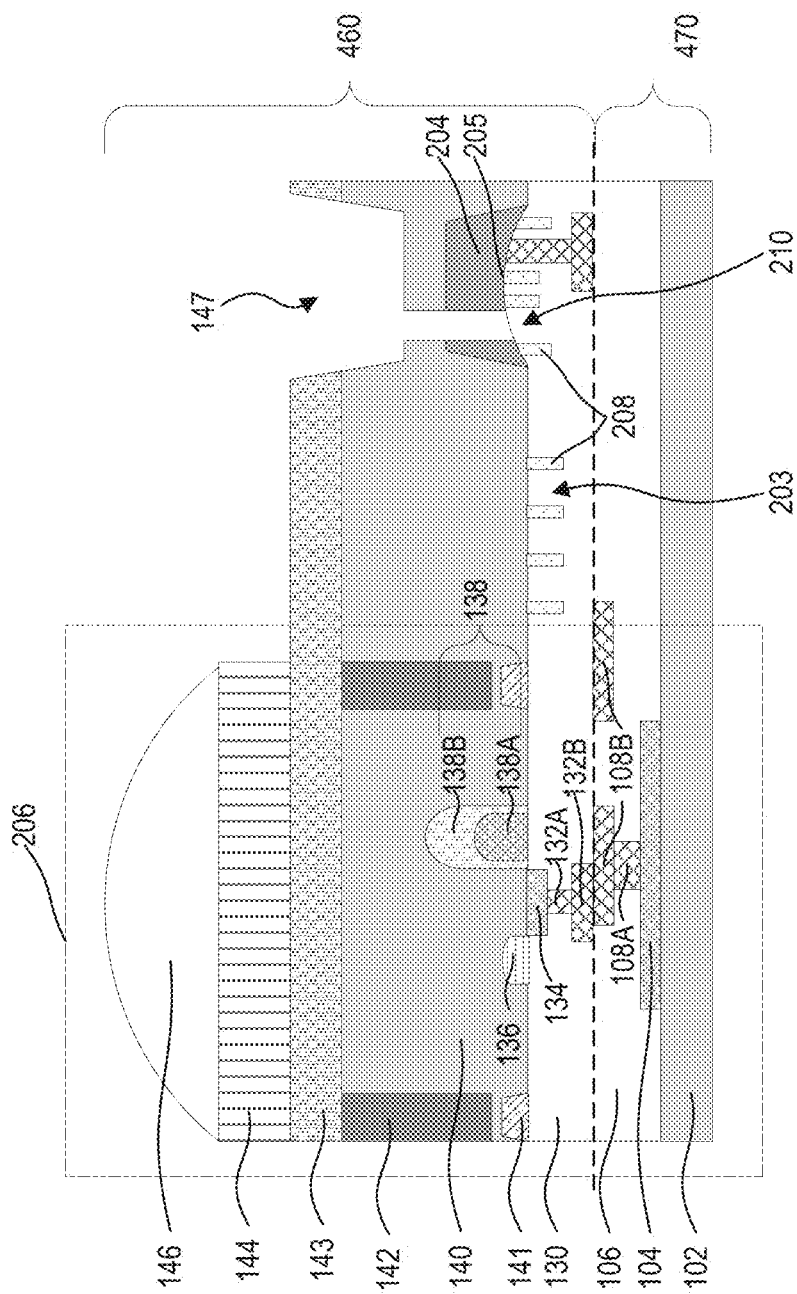

Referring to FIG. 5B, in operation 538, a wire bonding opening is formed through the passivation layer, the backside of the first substrate, and the extension pad. For example, as shown in FIG. 24, wire bonding opening 147 can be formed through passivation layer 143, the backside of first substrate 140, and extension pad 204. Wire bonding opening 147 can be formed by a dry etch process or a wet etch process in a manner similar to that described with reference to FIG. 7 and operation 504 of FIG. 5A. Wire bonding opening 147 can be formed through slot regions 210 of extension pad 204 to avoid contacting polysilicon pillars 208.

Figure 25:
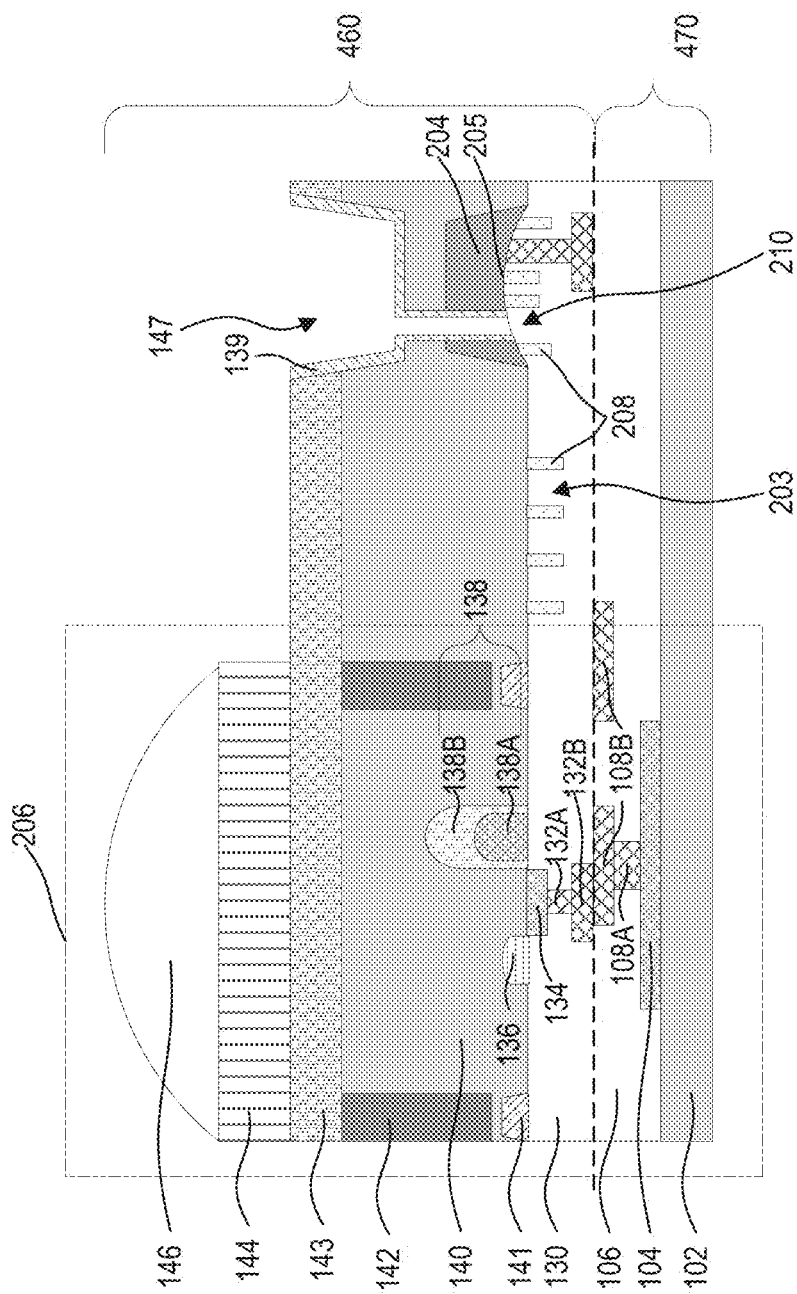

Referring to FIG. 5B, in operation 540, a barrier layer is formed in the wire bonding opening. For example, as shown in FIG. 25, barrier layer 139 can be formed in wire bonding opening 147. Barrier layer 139 can be deposited in wire bonding opening 147 by a CVD process or an ALD process.

Figure 26:
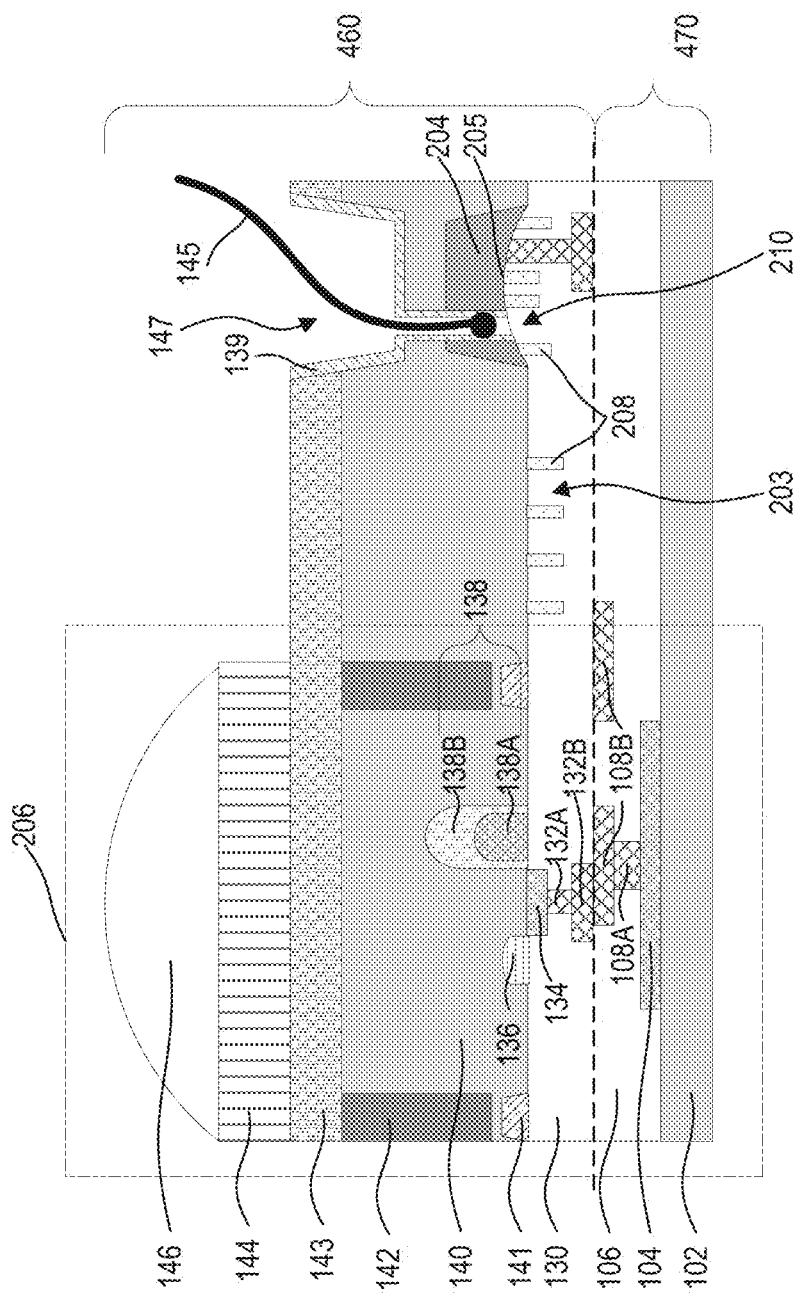

Referring to FIG. 5B, in operation 542, a wire is bonded in the wire bonding opening to the extension pad. For example, as shown in FIG. 26, wire 145 can be bonded in wire bonding opening 147 to extension pad 204. Wire 145 can be bonded on barrier layer 139. Wire 145 can be bonded to extension pad 204 by a thermocompression bonding process, a thermosonic bonding process, or an ultrasonic bonding process. Wire 145 can be bonded to extension pad 204 by a gold ball bonding process or an aluminum wedge bonding process. In some embodiments, wire 145 can be bonded to extension pad 204 by a soldering process and wire bonding opening 147 can be filled with a solder bump (not shown in FIG. 26).

The present disclosure provides an example image sensor (e.g., image sensor 400) with an ILD layer (e.g., first ILD layer 130) with improved uniformity and an example method (e.g., method 500) for fabricating the same. In some embodiments, polysilicon pillars (e.g., polysilicon pillars 208) can be formed on the extension pads (e.g., extension pad 204). The polysilicon pillars can provide structural support for the ILD layer deposited on the extension pads. The polysilicon pillars can reduce the polishing speed of the ILD layer deposited in or around the curved surface (e.g., curved surface 205) of the extension pads. Consequently, the polysilicon pillars can improve the polishing uniformity of the ILD layer across the image sensor. In some embodiments, a distance between a highest point on the polished ILD layer and a lowest point on the polished ILD layer can be less than about 400 nm.

In some embodiments, the polysilicon pillars on the extension pads can form a slot region (e.g., slot region 210). The slot region can be away from the polysilicon pillars. The slot region can be a rectangular region. The slot region can be used to connect the interconnect structure (e.g., the first interconnect structure including metal vias 132A and metal lines 132B) to the extension pads. The slot region can also be used to bond a wire (e.g., wire 145) to the extension pads.

In some embodiments, polysilicon pillars can also be formed in an area on the image sensor that is away from the array of pixels. The polysilicon pillars in the area away from the array of pixels can improve the uniformity of the ILD layer in that area. The polysilicon pillars on the extension pads and in the area away from the array of pixels can increase the polishing uniformity of the ILD layer. The uniform ILD layer can reduce electrical connection failures of the interconnect structure. The uniform ILD layer can also reduce bonding failures after the image sensors are bonded to another substrate (e.g., second substrate 102) containing application-specific circuits (e.g., application-specific circuit 104). The decreased electrical connection failures and the decreased bonding failures can improve device performance and reliability.

In some embodiments, an image sensor includes an image sensing element disposed on a substrate, an extension pad disposed adjacent to the image sensing element, and a polysilicon pillar disposed on the extension pad. The image sensor further includes an insulating layer disposed over the image sensing element, the extension pad, and the polysilicon pillar.

In some embodiments, an image sensor includes an array of image sensing elements disposed at a center portion of a chip, a plurality of extension pads disposed along a side portion of the chip, and a plurality of polysilicon pillars disposed on each extension pad of the plurality of extension pads. The image sensor further includes an interlayer dielectric (ILD) layer disposed over the array of image sensing elements, the plurality of extension pads, and the plurality of polysilicon pillars.

In some embodiments, a method includes forming an image sensing element on a substrate, forming an extension pad adjacent to the image sensing element, and forming a polysilicon pillar on the extension pad. The method further includes depositing an insulating layer over the image sensing element, the extension pad, and the polysilicon pillar. The method further includes polishing the insulating layer by a chemical mechanical planarization (CMP) process and forming an interconnect structure within the insulating layer and electrically coupled to the extension pad.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
   an image sensing element disposed in a substrate;
   an extension pad disposed adjacent to the image sensing element and coupled to an interconnect structure;
   a plurality of polysilicon pillars disposed on the extension pad and forming a slot region, wherein the slot region is configured to be electrically connected to the interconnect structure; and
   an insulating layer disposed over the image sensing element, the extension pad, and the polysilicon pillar.

2. The image sensor of claim 1, wherein the image sensing element comprises:
   a photodiode comprising an n-type region and a p-type region adjacent to the n-type region; and
   a transfer transistor, a diffusion well, a source follower, a reset transistor, a row select transistor, and an in-pixel circuit, wherein the in-pixel circuit comprises a column amplifier, a correlated double sampling (CDS) circuit, and combinations thereof.

3. The image sensor of claim 1, wherein the extension pad comprises a curved surface relative to a front surface of the substrate.

4. The image sensor of claim 1, wherein the polysilicon pillar has a height between about 500 nm and about 900 nm and a square cross section with a side length between about 2 nm and about 10 nm.

5. The image sensor of claim 1, further comprising another polysilicon pillar disposed adjacent to the extension pad.

6. The image sensor of claim 1, wherein a distance between a highest point on the insulating layer and a lowest point on the insulating layer is less than about 400 nm.

7. The image sensor of claim 1, wherein
   the interconnect structure is disposed within the insulating layer, and wherein the image sensor further comprises:
   a wire bonded to the extension pad to electrically couple the interconnect structure to a backside of the substrate.

8. The image sensor of claim 7, wherein the interconnect structure and the wire are disposed in an area away from the plurality of polysilicon pillars.

9. The image sensor of claim 1, further comprising another substrate bonded to the substrate, wherein the other substrate comprises an application-specific circuit comprising an analog-to-digital converter (ADC), a counter, a memory storage device, and combinations thereof.

10. The image sensor of claim 1, further comprising:
an isolation structure disposed adjacent to the image sensing element;
a passivation layer disposed on the image sensing element and the isolation structure;
a color filter disposed on the passivation layer; and
a micro lens disposed on the color filter.

11. An image sensor, comprising:
an array of image sensing elements disposed at a center portion of a chip;
a plurality of extension pads disposed along a side portion of the chip;
a plurality of polysilicon pillars disposed on each extension pad of the plurality of extension pads forming a slot region;
an interlayer dielectric (ILD) layer disposed over the array of image sensing elements, the plurality of extension pads, and the plurality of polysilicon pillars; and
an interconnect structure electrically connected to the slot region.

12. The image sensor of claim 11, wherein each extension pad of the plurality of extension pads comprises a curved surface relative to a front surface of the chip.

13. The image sensor of claim 11, wherein each extension pad of the plurality of extension pads comprises a slot region, wherein the slot region is away from the plurality of polysilicon pillars.

14. The image sensor of claim 11, wherein each polysilicon pillar of the plurality of polysilicon pillars has a height between about 500 nm and about 900 nm and a square cross section with a side length between about 2 nm and about 10 nm.

15. The image sensor of claim 11, wherein the plurality of polysilicon pillars are disposed in an area at the center portion of the chip that is away from the array of image sensing elements.

16. The image sensor of claim 11, wherein
the interconnect structure disposed within the ILD layer, and wherein the image sensor further comprises:
a wire bonded to the plurality of extension pads to electrically couple the interconnect structure to a backside of the chip.

17. A device, comprising:
a photodiode formed on a substrate;
an extension pad formed on the substrate;
a plurality of polysilicon pillars on the extension pad forming a slot region;
a dielectric layer disposed on the photodiode, the extension pad, and the plurality of polysilicon pillars; and
an interconnect structure electrically coupled to the extension pad and electrically connected to the slot region.

18. The device of claim 17, further comprising a wire bonded to the slot region of the extension pad.

19. The device of claim 18, wherein the wire is in a wire bonding opening formed in the extension pad and the substrate.

20. The device of claim 17, further comprising:
a passivation layer on the substrate; and
a color filter on the passivation layer.

* * * * *